United States Patent [19]

Koshizuka

[11] Patent Number: 4,606,012

[45] Date of Patent: Aug. 12, 1986

[54] SENSE AMPLIFIER

[75] Inventor: Atuo Koshizuka, Kawasaki, Japan

[73] Assignee: Fujitsu Limited, Kawasaki, Japan

[21] Appl. No.: 596,707

[22] Filed: Apr. 4, 1984

[30] Foreign Application Priority Data

Apr. 7, 1983 [JP] Japan ................................ 58-060032

[51] Int. Cl.[4] ........................ G11C 7/00; G01R 19/00;
H03F 3/45
[52] U.S. Cl. .................................... 365/189; 365/208;
365/230; 307/530
[58] Field of Search ................ 365/190, 202, 205, 206,
365/207, 208, 189, 230; 307/530; 330/253

[56] References Cited

U.S. PATENT DOCUMENTS 3,983,412 9/1976 Roberts et al. ...................... 365/207
4,375,039 2/1983 Yamauchi ........................... 330/253
4,509,147 4/1985 Tanimura et al. ................... 365/207

Primary Examiner—Terrell W. Fears
Assistant Examiner—Guy M. Miller
Attorney, Agent, or Firm—Staas & Halsey

[57] ABSTRACT

A sense amplifier comprising two asymmetrical differential amplifiers connected to each other in such a way that their outputs are accelerated to charge up one another by utilizing nodes at which potentials are changed in response to a change of the input signal supplied from a pair of bit lines or a pair of data lines, whereby the operating speed of the sense amplifier is increased.

7 Claims, 6 Drawing Figures

SENSE AMPLIFIER

BACKGROUND OF THE INVENTION

The present invention relates to a sense amplifier, and more particularly to a complementary metal-oxide semiconductor (CMOS) high-speed sense amplifier for amplifying a potential difference between a pair of bit lines or a pair of data buses in a static semiconductor memory.

Accompanied by the recent developments in the high integration of semiconductor memories, each transistor constituting a memory cell has become more and more miniaturized. This miniaturization has reduced the driving capability of a transistor, lowered the speed of the potential change, during reading, of a pair of bit lines or a pair of data buses connected to a sense amplifier, and decreased the potential difference between a pair of bit lines or a pair of data buses. To detect the thusly decreased and slowly changing potential difference between a pair of bit lines or a pair of data buses, an improved high-speed sense amplifier is necessary.

A conventional sense amplifier cannot provide a high-speed operation with such a decreased and slowly changing potential difference, because of a long rising period and a large amplitude of the output signal, as described later in more detail.

SUMMARY OF THE INVENTION

Accordingly, an object of the present invention is to provide a sense amplifier which can operate at a high speed in response to a change of a potential of a pair of bit lines or a pair of data lines.

Another object of the present invention is to provide a sense amplifier which can change the output potential at a high speed in response to a change of a potential of a pair of bit lines or a pair of data lines.

To attain the above objects, the present invention employs two asymmetrical differential amplifiers connected to each other in such a way that their outputs are accelerated, to charge up one another by utilizing nodes at which potentials are changed in response to a change of the input signal supplied from a pair of bit lines or a pair of data lines.

According to the present invention, there is provided a sense amplifier comprising a pair of differential amplifier circuits each including a pair of differential input transistors for receiving complementary signals and a feedback transistor connected to a commonly connecting point of the pair of differential input transistors and having a control input connected to an output of one of the differential input transistors. The complementary signals applied to one of the pair of differential amplifier circuits have phases opposite to the phases of the complementary signals applied to the other of the pair of differential amplifier circuits. At least one of the pair of differential amplifier circuits has a first output pull up transistor and a second output pull up transistor connected in parallel between a power supply and an output end. The first output pull up transistor has a control input connected to the control input of the feedback transistor. The second output pull up transistor has a control input connected to an output of the feedback transistor in the other of the differential amplifier circuits.

BRIEF DESCRIPTION OF THE DRAWINGS

The above objects, features, and other advantages of the present invention will become more apparent from the following description of the embodiments with reference to the accompanying drawings, wherein.

DESCRIPTION OF THE PREFERRED EMBODIMENT

Figure 1:
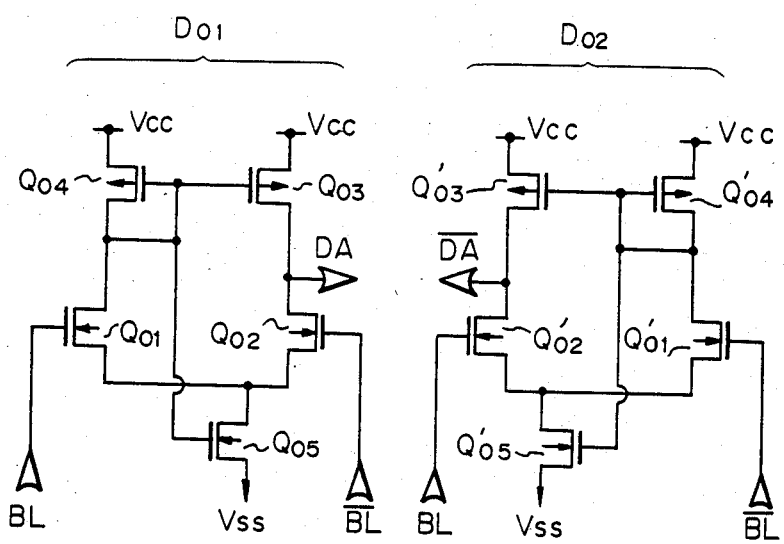
FIG. 1 is a circuit diagram showing a conventional sense amplifier.

Before describing the embodiment of the present invention, a conventional sense amplifier will first be described with reference to FIG. 1. In FIG. 1, the conventional sense amplifier consists of two asymmetrical differential amplifiers $D_{01}$ and $D_{02}$. The first differential amplifier $D_{01}$ includes N-channel input transistors $Q_{01}$ and $Q_{02}$, P-channel pull-up transistors $Q_{03}$ and $Q_{04}$, and an N-channel feedback transistor $Q_{05}$. A pair of bit lines BL and $\overline{BL}$ are connected to the gates of the input transistors $Q_{01}$ and $Q_{02}$, respectively. An output signal DA is obtained at a commonly connecting point between the drain of the P-channel pull-up transistor $Q_{03}$ and the drain of the N-channel input transistor $Q_{02}$. The second differential amplifier $D_{02}$ has the same constitution as the first sense amplifier unit $D_{01}$ and includes transistors $Q_{01}'$ through $Q_{05}'$.

When the bit line BL is at a high potential (H) and the bit line $\overline{BL}$ is at a low potential (L), in the first differential amplifier $D_{01}$, the transistor $Q_{01}$ has a high mutual conductance $g_m$ (H) and the transistor $Q_{02}$ has a low mutual conductance $g_m$ (L). Therefore, the P-channel pull up transistors $Q_{03}$ and $Q_{04}$ receive a low potential at their gates and have the high mutual conductance $g_m$ (H). Thus, the output signal DA is at a high level. The feedback transistor $Q_{05}$ receives a low potential at its gate and has the low mutual conductance $g_m$ (L), ensuring the high level of the output signal DA. In contrast, in the second differential amplifier $D_{02}$, the transistors $Q_{01}'$, $Q_{03}'$, and $Q_{04}'$ have the low mutual conductance $g_m$ (L), and the transistors $Q_{02}'$ and $Q_{05}'$ have the high mutual conductance $g_m$ (H), so that the output signal $\overline{DA}$ is at a low level.

Contrary to the above, when the bit line BL is at an L level and the bit line $\overline{BL}$ is at an H level, it will be easily seen that the output signal DA is at an L level and the output signal $\overline{DA}$ is at an H level.

The conventional sense amplifier shown in FIG. 1, however, has a disadvantage of low-speed operation. That is, it takes a considerably long period from a time at which a pair of bit lines inverts its potential to a time at which a pair of the output potentials of the sense amplifier are inverted. This is because the output potential is raised only by the single pull-up transistor $Q_{03}$ or $Q_{03}'$, and the output potential is lowered only by the single transistor $Q_{02}$ or $Q_{02}'$. Another reason for the low-speed operation is that the amplitude of the output signal DA or $\overline{DA}$, which is determined by the transistors $Q_{03}$, $Q_{02}$, and $Q_{05}$, is relatively large.

Figure 3:
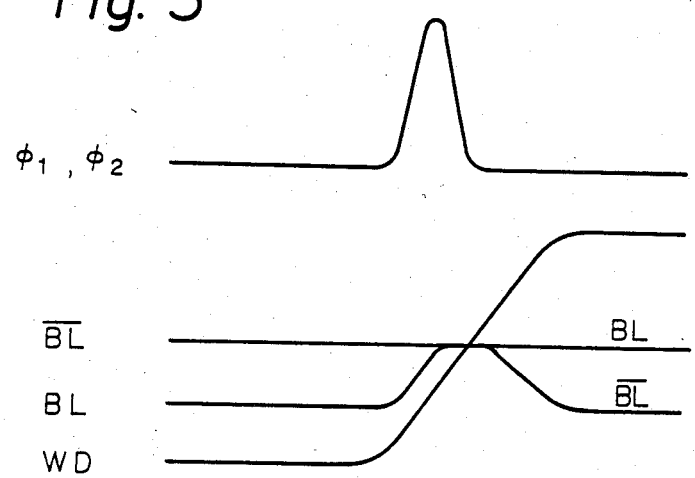
FIG. 3 is a waveform diagram showing the operation of the device shown in FIG. 2.
Figure 2:
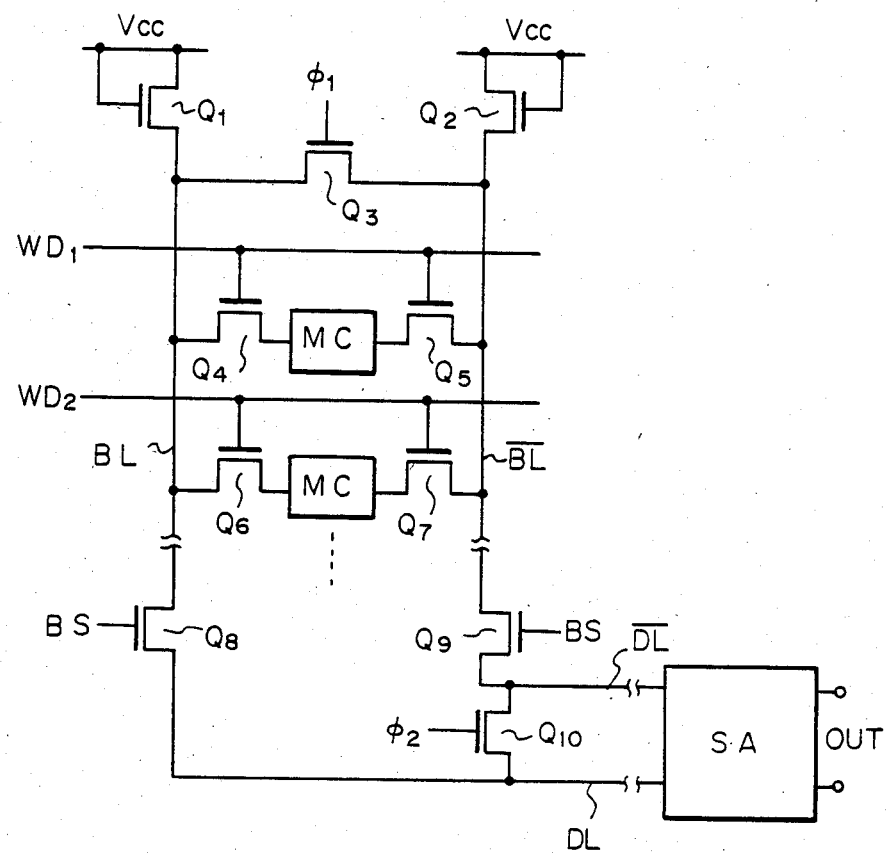
FIG. 2 is a circuit diagram showing a part of a semiconductor memory device to which the present invention is applied.

FIG. 2 shows a part of a semiconductor memory device to which the present invention may be applied. FIG. 3 is a waveform diagram showing the operation of the device shown in FIG. 2. Referring to FIGS. 2 and 3, when clock signals $\phi_1$ and $\phi_2$ are applied to the gates of precharging transistors $Q_3$ and $Q_{10}$, bit lines BL and $\overline{BL}$, and data lines DL and $\overline{DL}$ are shortcircuited. In this example, the bit lines BL and $\overline{BL}$ are precharged through transistors $Q_1$ and $Q_2$ to have a high potential. Then, when a word line, for example, a word line $WD_1$ is selected to be a high potential, one of the bit lines BL and $\overline{BL}$, for example, $\overline{BL}$, is turned to have a low potential, depending on the contents of a selected memory cell. The potential of the other bit line BL is not changed in this example. After this, when a bit-line selecting signal BS is applied to the gates of transfer-gate transistors $Q_8$ and $Q_9$, the potentials of the bit lines BL and $\overline{BL}$ are transferred through the transistors $Q_8$ and $Q_9$ to the data lines DL and $\overline{DL}$. A sense amplifier SA amplifies the potential difference between the data lines DL and $\overline{DL}$. According to the present invention, the sense amplifier SA is improved, as is later described in detail.

Another example of a semiconductor memory device is known in which a pair of bit lines are precharged to have an intermediate potential between a high potential and a low potential.

As will be described later in more detail, the present invention is effective whether a pair of bit lines are precharged to have a high potential or to have an intermediate potential.

An embodiment of the present invention will now be described in detail in the following.

Figure 4:
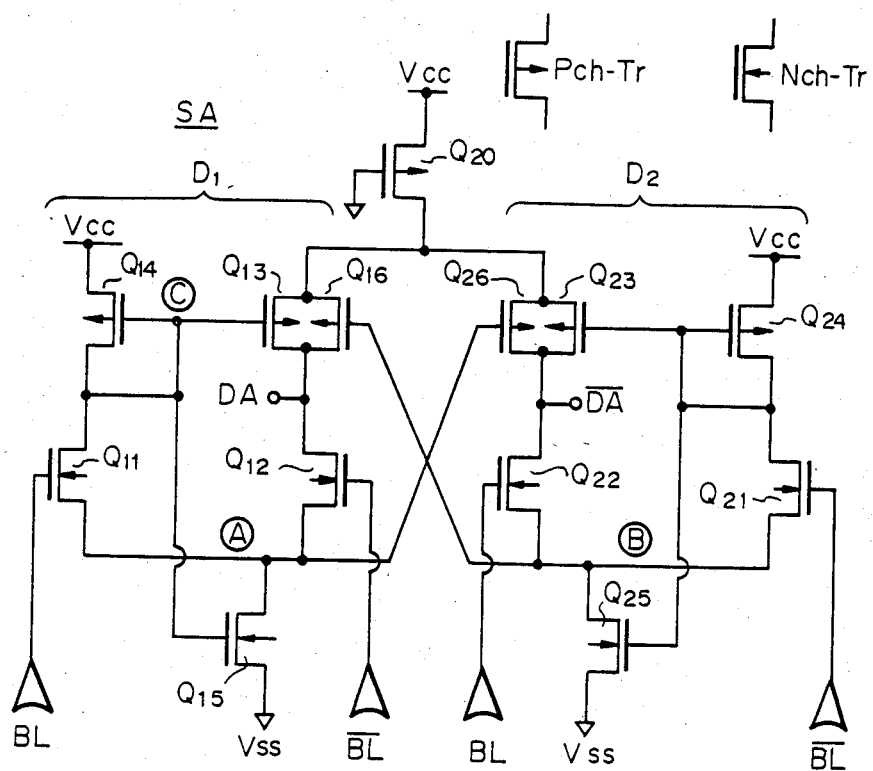
FIG. 4 is a circuit diagram showing a sense amplifier according to an embodiment of the present invention.

FIG. 4 is a circuit diagram showing a sense amplifier according to an embodiment of the present invention. In FIG. 4, a sense amplifier SA consists of a first differential amplifier $D_1$ and a second differential amplifier $D_2$. The first differential amplifier $D_1$ comprises a first input transistor $Q_{11}$, a second input transistor $Q_{12}$, a first output pull up transistor $Q_{13}$, a pull up transistor $Q_{14}$, a feedback transistor $Q_{15}$, and a second output pull up transistor $Q_{16}$. In this embodiment, the transistors $Q_{13}$, $Q_{14}$, and $Q_{16}$ are P channel metal-oxide semiconductor (MOS) transistors, and the transistors $Q_{11}$, $Q_{12}$, and $Q_{15}$ are N channel MOS transistors. A bit line BL is connected to the gate of the first input transistor $Q_{11}$. A bit line $\overline{BL}$ is connected to the gate of the second input transistor $Q_{12}$. The drain of the first input transistor $Q_{11}$ is connected to the gate and the drain of the pull up transistor $Q_{14}$, to the gate of the first output pull up transistor $Q_{13}$, and to the gate of the feedback transistor $Q_{15}$. The source of the pull up transistor $Q_{14}$ is connected to a power supply $V_{CC}$. The drains of the first and the second output pull up transistors $Q_{13}$ and $Q_{16}$ are connected to the drain of the second input transistor $Q_{12}$. The sources of the first and the second input transistors $Q_{11}$ and $Q_{12}$ are connected to the drain of the feedback transistor $Q_{15}$. The source of the feedback transistor $Q_{15}$ is connected to a ground line $V_{SS}$. An output end DA is connected to a point between the drains of the output pull up transistor $Q_{13}$ or $Q_{16}$ and the second input transistor $Q_{12}$.

The second output pull up transistor $Q_{16}$ is provided according to the present invention.

The circuit constitution of the second differential amplifier $D_2$ is similar to that of the first differential amplifier $D_1$, and includes a first input transistor $Q_{21}$, a second input transistor $Q_{22}$, a first output pull up transistor $Q_{23}$, a pull up transistor $Q_{24}$, a feedback transistor $Q_{25}$, and a second output pull up transistor $Q_{26}$. It should be noted, however, that, in contrast to the first differential amplifier $D_1$, the second differential amplifier $D_2$ receives a signal on the bit line BL at the gate of the second input transistor $Q_{22}$ and receives a signal on the bit line $\overline{BL}$ at the gate of the first input transistor $Q_{21}$. The signals on the bit lines BL and $\overline{BL}$, after the bit lines are selected, are complementary. The abovementioned difference lies in the fact that the complementary signals applied to the first differential amplifier $D_1$ have phases opposite to the phases of the complementary signals applied to the second differential amplifier $D_2$.

According to the present invention, an output amplitude determining transistor $Q_{20}$ is provided between the sources of the output pull up transistors $Q_{13}$, $Q_{16}$, $Q_{23}$, and $Q_{26}$ and the power supply $V_{CC}$. The transistor $Q_{20}$ in this embodiment is a P-channel MOS transistor. The source of the transistor $Q_{20}$ is connected to the power supply $V_{CC}$. The drain of the transistor $Q_{20}$ is connected to the sources of the transistors $Q_{13}$, $Q_{16}$, $Q_{23}$, and $Q_{26}$. The gate of the transistor $Q_{20}$ is grounded. Accordingly, the transistor $Q_{20}$ is normally in a conductive state.

The sources of the input transistors $Q_{11}$ and $Q_{12}$ in the first differential amplifier $D_1$ are connected to the gate of the second output pull up transistor $Q_{26}$ in the second differential amplifier $D_2$. The sources of the input transistors $Q_{21}$ and $Q_{22}$ are connected to the gate of the second pull up transistor $Q_{16}$ in the first differential amplifier $D_1$.

Thus, the first differential amplifier $D_1$ and the second differential amplifier $D_2$ each constitute a complementary MOS (CMOS) differential amplifier having the P channel output pull up transistor and the N channel input transistor.

The second output pull up transistors $Q_{16}$ and $Q_{26}$ function to accelerate the charging up of the output ends DA and $\overline{DA}$, respectively.

As will be apparent by comparing FIGS. 1 and 4, the conventional sense amplifier shown in FIG. 1 is equivalent to the circuit in which the second output pull up transistors $Q_{16}$ and $Q_{26}$ and the output amplitude determining transistor $Q_{20}$ are removed from the circuit shown in FIG. 4.

Figure 5:
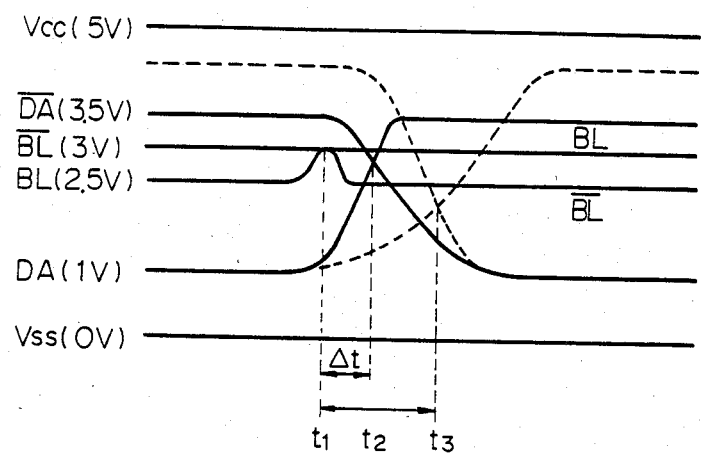
FIG. 5 is a waveform diagram showing an example of the operation of the circuit shown in FIG. 4.

FIG. 5 is a waveform diagram showing an example of the operation of the circuit shown in FIG. 4. In FIG. 5, the potential of the power supply $V_{CC}$ is assumed to be about 5 V, and the potential of the ground line $V_{SS}$ is assumed to be about 0 V. Also, at the beginning, it is assumed that the bit line BL is at the low potential (L level) of about 2.5 V, and the bit line $\overline{BL}$ is at the high potential (H level) of about 3 V. Accompanied by the miniaturization of a memory cell as mentioned before, the potential difference between the bit lines becomes as small as 0.5 V. By applying the L level to the gate of the first input transistor $Q_{11}$ in the first differential amplifier, the first input transistor $Q_{11}$ has a low mutual conductance $g_m$ (L), so that the potential at a node Ⓒ connected to the gates of the transistors $Q_{13}$ and $Q_{14}$ is at a high level, causing the P-channel transistors $Q_{13}$ and $Q_{16}$ to have a low mutual conductance $g_m$ (L), and causing the N-channel feedback transistor $Q_{15}$ to have a high mutual conductance $g_m$ (H). Also, because the H level is applied to the gate of the second input transistor $Q_{12}$, it has a high mutual conductance $g_m$ (H).

On the other hand, in the second differential amplifier, the first input transistor $Q_{21}$ has the high mutual conductance $g_m$ (H) and, accordingly, the P-channel transistors $Q_{23}$ and $Q_{24}$ have the high mutual conductance $g_m$ (H). The feedback transistor $Q_{25}$ has the low mutual conductance $g_m$ (L). The second input transistor $Q_{22}$ has the low mutual conductance $g_m$ (L).

Since the feedback transistor $Q_{25}$ has the low mutual conductance $g_m$ (L), the potential at a node (B) connected to the drain of the transistor $Q_{25}$ is at a high level. The node (B) is connected to the gate of the second output pull up transistor $Q_{16}$ in the first differential amplifier $D_1$. Therefore the transistor $Q_{16}$ has the low mutual conductance $g_m$ (L). As a result, in the first differential amplifier $D_1$, the transistors $Q_{13}$ and $Q_{16}$ have the low mutual conductance $g_m$ (L), and the transistors $Q_{22}$ and $Q_{25}$ have the high mutual conductance $g_m$ (H), so that the potential at the output end DA is at a low level of about 1 V.

Since the feedback transistor $Q_{15}$ has the high mutual conductance $g_m$ (H), the potential at a node (A) connected to the drain of the transistor $Q_{15}$ is at a low level. The node (A) is connected to the gate of the second output pull up transistor $Q_{26}$ in the second differential amplifier $D_2$. Therefore, the transistor $Q_{26}$ has the high mutual conductance $g_m$ (H). As a result, in the second differential amplifier $D_2$, the transistors $Q_{23}$ and $Q_{26}$ have the high mutual conductance $g_m$ (H), and the transistors $Q_{22}$ and $Q_{25}$ have the low mutual conductance $g_m$ (L), so that the potential at the output end $\overline{DA}$ is at a high level of about 3.5 V.

At a time $t_1$, the pair of bit lines BL and $\overline{BL}$ are precharged to have the same potential of 3 V. By this precharging, the transistors $Q_{11}$, $Q_{13}$ and $Q_{14}$ in the first differential amplifier $D_1$, and the transistor $Q_{22}$ in the second differential amplifier $D_2$ are turned to have the high mutual conductance $g_m$ (H). Also, the transistor $Q_{15}$ is turned to have the low mutual conductance $g_m$ (L).

Then, the potentials of the bit lines BL and $\overline{BL}$ are inverted in accordance with the content of the selected memory cell, so that the bit line BL is kept at the high potential of 3 V and the bit line $\overline{BL}$ is turned to the low potential of 2.5 V. Since the feedback transistor $Q_{15}$ has, at this stage, the low mutual conductance $g_m$ (L), the potential at the node (A) is raised so that the mutual conductance of the transistor $Q_{26}$ is lowered. On the other hand, in the second differential amplifier $D_2$, the transistors $Q_{21}$, $Q_{23}$, and $Q_{24}$ have, at this stage, the low mutual conductance $g_m$ (L), and the transistors $Q_{22}$ and $Q_{25}$ have the high mutual conductance $g_m$ (H). As a result, the potential at the node B is lowered so that the mutual conductance of the transistor $Q_{16}$ for accelerating the charge up of the output end DA is increased. The potential at the node (B) is lower than the potential at the node (C) which is also at a low level. Therefore, the second output pull up transistor $Q_{16}$ becomes more active than the first output pull up transistor $Q_{13}$. As a result, the second output pull up transistor $Q_{16}$ is rapidly turned to be more conductive, accelerating the charge up of the outuput end DA to the high level of about 3.5 V.

In the second differential amplifier $D_2$, the transistors $Q_{23}$ and $Q_{26}$ are turned to have the low mutual conductance $g_m$ (L) and the transistors $Q_{22}$ and $Q_{25}$ are turned to have the high mutual conductance $g_m$ (H), so that the charges stored at the output end $\overline{DA}$ are discharged through the transistors $Q_{22}$ and $Q_{26}$ to the ground line $V_{SS}$. Thus, the potential at the output end $\overline{DA}$ is gradually decreased, and as a result, at a time $t_2$, the potentials at the output ends DA and $\overline{DA}$ are inverted.

It will be seen from FIG. 5 that a period $\Delta t$ between the time $t_1$ and the time $t_2$ is a response period of the sense amplifier SA in response to an inversion of the bit lines. The response period $\Delta t$ is shortened in comparison with the conventional response period. One reason for this is because the rise of the potential at the output end DA is accelerated by the function of the second output pull up transistor $Q_{16}$. Another reason is that the high level of the potential at the output end DA is limited to a low voltage of about 3.5 V by providing the output amplitude determining transistor $Q_{20}$. The high level of the potential at the output end DA is adjustable by adjusting the dimensions of the transistors $Q_{16}$ and $Q_{20}$.

The operation of the sense amplifier SA in response to a potential change of the bit line BL from the high level to the low level is similar to the operation described above.

In the conventional sense amplifier shown in FIG. 1, which does not have the second output pull up transistors $Q_{16}$ and $Q_{26}$ and the output amplitude determining transistor $Q_{20}$, the potential at the output end DA rises in response to the increase of the mutual conductance of the transistor $Q_{03}$ and to the decrease of the mutual conductance of the transistor $Q_{02}$. However, as illustrated by a dash curve in FIG. 5, the rise of the potential at the output end DA is very slow and the high level is higher in comparison with the embodiment of the present invention. This is due to the lack of the second output pull up transistor $Q_{16}$ and the output amplitude determining transistor $Q_{20}$. Therefore, a time $t_3$, at which the potentials of the output ends DA and $\overline{DA}$ of the dash curves cross, is later than the time $t_2$ in the embodiment of the present invention.

More precisely, in the conventional sense amplifier shown in FIG. 1, when the bit lines BL and $\overline{BL}$ are precharged to have the high potential of about 3 V, the transistors $Q_{01}$, $Q_{02}$, $Q_{03}$, and $Q_{04}$ have the high mutual conductance $g_m$ (H), and the transistor $Q_{05}$ has the low mutual conductance $g_m$ (L). Then when the potential of the bit line $\overline{BL}$ is lowered, the transistor $Q_{02}$ is turned to have the low mutual conductance $g_m$ (L). As a result, the potential at the output end DA is pulled up through the transistor $Q_{03}$. Therefore, only the second input transistor $Q_{02}$ changes its state to assist the rise of the potential at the output end DA. No acceleration to raise the output potential is carried out in the conventional sense amplifier.

Figure 6:
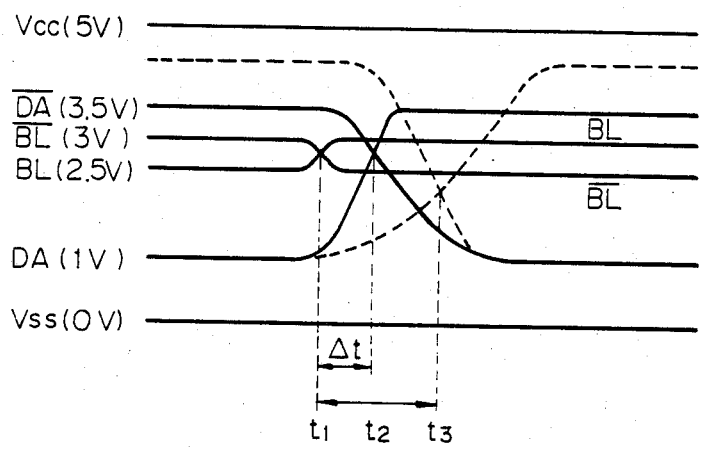
FIG. 6 is a waveform diagram showing another example of the operation of the circuit shown in FIG. 4.

FIG. 6 is a waveform diagram showing another example of the operation of the circuit shown in FIG. 4. In FIG. 6, the only difference from FIG. 5 is that the pair of bit lines BL and $\overline{BL}$ are precharged not to the high level of about 3 V but to an intermediate level between 3 V and 2.5 V. The operation of the sense amplifier SA in this case is similar to that described with reference to FIG. 5, and therefore, is not described here.

The present invention is not restricted to the above-described embodiment. Various changes and modifications are possible. For example, in place of the CMOS asymmetrical differential amplifier, any other type of asymmetrical differential amplifier may be employed within the scope of the present invention.

From the foregoing description, it will be apparent that, according to the present invention, by employing two asymmetrical differential amplifiers having the same circuit configuration, and by connecting them so as to accelerate the charge up of the outputs of the asymmetrical differential amplifiers by utilizing nodes whose potentials are changed in response to changes of input potentials, a sense amplifier according to the present invention can change its output potential at a higher speed in comparison with the conventional sense amplifier.

I claim:

1. A sense amplifier comprising
a pair of differential amplifier circuits, for receiving complementary input signals and producing complementary output signals, each of said differential amplifier circuits including:
a pair of differential input transistors for receiving said complementary input signals, each said differential input transistor having a source connected at a common connecting point of the respective differential amplifier circuit to the source of the other differential input transistor, a gate connected to receive a respective one of said complementary input signals, and a drain, wherein said complementary signals applied to a first one of the pair of differential amplifier circuits have respective phases opposite to the phases of said complementary signals applied to the other of said pair of differential amplifier circuits;
a feedback transistor having a drain connected to said commonly connecting point, a source connected to ground, and a gate connected to said drain of a first one of the differential input transistors;
first pull up means connected between a power supply and to said drain of the second of the differential input transistors; and
second pull up means including an output pull up transistor having a source and a drain connected between the power supply and the second differential input transistor,
wherein each said output pull up transistor in each said differential amplifier circuit has a gate connected to receive an output of said feedback transistor in the other one of said differential amplifier circuits.

2. A sense amplifier as set forth in claim 1, wherein each of said differential input transistors and each said feedback transistor is an N channel MOS transistor, and each said output pull up transistor is a P channel MOS transistor.

3. A sense amplifier as set forth in claim 2, further comprising an output amplitude determining transistor connected between the source of both said output pull up transistors and said power supply.

4. A sense amplifier as set forth in claim 2, further comprising a respective P channel MOS transistor in each said differential amplifier circuit, each having its source connected to said power supply, its drain connected to the drain of the first differential input transistor, and its gate connected to a control input of the respective first pull up means.

5. A sense amplifier as set forth in claim 3, wherein said output amplitude determining transistor is a P channel MOS transistor having a gate connected to a ground line.

6. A sense amplifier as set forth in claim 3, wherein said first pull up means comprises a P channel MOS transistor with its drain connected to the drain of the output pull up transistor of the second pull up means.

7. A sense amplifier as set forth in claim 1, wherein said first pull up means comprises a P channel MOS transistor with its drain connected to the drain of the output pull up transistor of the second pull up means.

* * * * *

UNITED STATES PATENT AND TRADEMARK OFFICE
CERTIFICATE OF CORRECTION

PATENT NO. : 4,606,012

DATED : 12 August 1986

INVENTOR(S) : KOSHIZUKA

It is certified that error appears in the above-identified patent and that said Letters Patent is hereby corrected as shown below:

Column 3, line 9, "shortcircuited" should be --short-circuited--.

Column 5, line 52, "B" should be --Ⓑ--;
line 61, "outuput" should be --output--.

Column 6, line 1, "DA" should be --$\overline{DA}$--.

Signed and Sealed this

Eighteenth Day of November, 1986

*Attest:*

DONALD J. QUIGG

*Attesting Officer*  *Commissioner of Patents and Trademarks*